United States Patent [19]

Risch et al.

[11] Patent Number: 5,443,992
[45] Date of Patent: Aug. 22, 1995

[54] METHOD FOR MANUFACTURING AN INTEGRATED CIRCUIT HAVING AT LEAST ONE MOS TRANSISTOR

[75] Inventors: Lothar Risch, Neubiberg; Thomas Vogelsang; Franz Hofmann, both of Munich; Karl Hofmann, Wennigsen, all of Germany

[73] Assignee: Siemens Aktiengesellschaft, Munich, Germany

[21] Appl. No.: 332,733

[22] Filed: Nov. 1, 1994

[30] Foreign Application Priority Data

Dec. 1, 1993 [DE] Germany .................. 43 40 967.9

[51] Int. Cl.⁶ ................ H01L 21/265; H01L 21/302; H01L 21/76; H01L 21/20
[52] U.S. Cl. .......................... 437/29; 437/41; 437/63; 437/89; 437/203; 257/329
[58] Field of Search ............ 437/29, 34, 41, 89, 437/63, 78, 126, 64; 257/329, 330, 331, 332, 333, 334

[56] References Cited

U.S. PATENT DOCUMENTS

| | | | |
|---|---|---|---|
| 4,412,868 | 11/1983 | Brown et al. | 437/89 |
| 4,740,826 | 4/1988 | Chatterjee | |
| 4,788,158 | 11/1988 | Chatterjee | 437/41 |
| 4,824,797 | 4/1989 | Goth | 437/63 |
| 4,942,445 | 7/1990 | Baliga et al. | 257/330 |
| 4,951,102 | 8/1990 | Beitman et al. | |
| 4,992,838 | 2/1991 | Mori | 257/330 |
| 4,994,871 | 2/1991 | Chang et al. | 257/331 |
| 5,072,276 | 12/1991 | Mahli et al. | |
| 5,164,325 | 11/1992 | Cogan et al. | 437/203 |
| 5,240,865 | 8/1993 | Mahli | 437/64 |
| 5,378,914 | 1/1995 | Ohzu et al. | 257/330 |

FOREIGN PATENT DOCUMENTS 2066969  3/1990  Japan .

OTHER PUBLICATIONS

H. Grossner et al. "Vertical Si-MOSFETs with Channel Lengths Down to 45 nm", Extended Abstracts of the 1993 International Conference on Solid State Devices and Materials, Makuhari, 1993, pp. 422-424.

Primary Examiner—Olik Chaudhuri
Assistant Examiner—Brian Dutton
Attorney, Agent, or Firm—Hill, Steadman & Simpson

[57] ABSTRACT

An insulating layer is grown on a principal face of a substrate that comprises a source terminal region. A first opening wherein the surface of the source terminal region is partially uncovered is provided in the insulating layer. A vertical layer sequence that comprises at least a channel region and a drain region for the MOS transistor is produced in the first opening by epitaxial growth of semiconductor material within situ doping. A second opening that is at least of a depth corresponding to the sum of the thicknesses of drain region and channel region is produced in the layer structure, a gate dielectric is applied on the surface thereof and a gate-electrode is applied on said gate dielectric.

10 Claims, 3 Drawing Sheets

METHOD FOR MANUFACTURING AN INTEGRATED CIRCUIT HAVING AT LEAST ONE MOS TRANSISTOR

BACKGROUND OF THE INVENTION

1. Field of the Invention

The present invention relates to the manufacture of semiconductor devices and, more particularly, the present invention relates to an improved method of manufacturing semiconductor devices which incorporate MOS transistors.

2. Description of the Related Art

Integrated circuits, CMOS transistors and logic gates currently are typically realized in planar silicon technology, with lateral arrangement of a source, channel region and drain. The gate lengths obtainable in such a design are dependent on the resolution of the optical lithography employed and the tolerances in structuring and adjustment thereof. Typical gate lengths of 0.6 μm can be achieved by 16M generation and typical gate lengths of 35 μm can be achieved by 64M generation.

Further miniaturization of the lateral channel lengths is desired in view of the electrical properties of MOS transistors as well as the increased packing density that has become especially desirable in complex logic circuits. In these designs, a plurality of n-channel and p-channel transistors must be both insulated from one another and wired to one another. Improvements in optical lithography as well as in lacquer and etching technology are required in order to accomplish further miniaturization. As a result of the limited resolution of optical lithography and increasing problems with tolerances in the structuring and adjustment of these manufacturing processes, it is doubtful that transistors having channel lengths below 100 nm can be reliably manufactured with these procedures. Moreover, miniaturization of the lateral channel lengths results in modification of the electrical properties of the MOS transistor which must be compensated by implantation of dopants in the channel region as well as by increased design complexity of source/drain structures.

Smaller structural sizes can be achieved in planar technology when optical lithography is replaced by electron beam lithography. Manufacturing individual, functional MOS transistors having channel lengths down to 50 nm has been accomplished with an electron beam printer on a laboratory scale. However, because electron beam lithography is slow, it is economically unsuitable for use in semiconductor fabrication on a large scale.

As an alternative to these manufacturing processes, it was proposed in the 1980's (see, for example, F. E. Holmes et al., Solid State Electronics, 17 (1974) pp. 791 ff) to manufacture vertical transistors in what is referred to as V-MOS technology. The source, channel region and drain of these devices are realized as vertical layer sequences in a substrate. Gate dielectric and gate electrode regions are realized at the surface of a trench that has a V-shaped profile. Transistors having channel lengths shorter than that allowed with the lithography available at that time could thereby be manufactured. This proposal did not achieve significance in logic design and development compared with planar manufacturing methods because only the channel length was small in these transistors resulting in large parasitic capacitances for the overall circuit.

In the development of DRAM memories, Texas Instruments (see, for example, W. F. Richardson et al., IDEM Dig. Tech. paper (1985), pp. 714–717) proposed that transistors and capacitors be vertically integrated in what is referred to as a "trench transistor cell". The transistor proposed in such a design comprises a channel length on the order of approximately 1 μm. However, only the arrangement of the capacitor in the trench subsequently prevailed in memory development.

An overview of the use possibilities of molecular beam epitaxy is provided in the introduction to the dissertation by W. Kiunke, 1992, pp. 2–3. In molecular beam epitaxy, uniform layers having a minimum thickness on the order of one layer of atoms can be manufactured in a controlled fashion. Doping in the range from $10^{14}$ cm$^{-3}$ through $10^{20}$ cm$^{-3}$ is possible in situ during the epitaxy stage by adding a gas containing dopant. As an applied example, a proposal for a vertical CMOS inverter is discussed. The proposed inverter is realized as a mesa structure on a substrate. The mesa structure comprises an npnpnp layer sequence with vertical sidewalls. All vertical sidewalls of the layers are provided with a gate dielectric and a gate electrode at one side. The gate electrode is insulated from the substrate only by the gate dielectric, so that this structure exhibits large parasitic capacitances.

The present invention improves upon these known prior art semiconductor manufacturing methods and provides a technical advance by providing a method of manufacturing semiconductors which can reliably manufacture smaller MOS transistor structures. The invention is directed to a method for manufacturing MOS transistors having a defined channel length in the range down to below 50 nm. In particular, the method is suitable for the manufacture of compact, high speed logic gates.

SUMMARY OF THE INVENTION

In the present invention, a source terminal region is produced at a principal face of a substrate, such as a silicon wafer. The source terminal region can be formed at the principal face of the silicon wafer both as a continuous, doped layer as well as a doped well. Alternatively, an SOI substrate can be employed as the substrate. This design comprises a silicon wafer, an insulating layer on the silicon wafer and a single-crystal silicon layer arranged on the insulating layer. A source terminal region is located in the single-crystal silicon layer. In order to achieve the highest packing density, it is surrounded by an insulating trench.

After producing the source terminal region, an insulating layer having a first opening is applied surface,-wide onto the principal face. The surface for the later source region is uncovered within this first opening. A vertical layer sequence that comprises at least one channel region and a drain region and preferably additionally comprises a source region for the MOS transistor is produced in the first opening by epitaxially growing doped semiconductor material. The source terminal region also functions as the source region when the layer sequence comprises only the channel region and the drain region.

All epitaxial methods are suitable for producing the vertical layer sequence. The layer sequence is preferably produced by molecular beam epitaxy, with which especially thin layers can be produced. Alternatively, it is produced by selective epitaxy, particularly in a RTP-CVD (Rapid Thermal Processing-Chemical Vapor Deposition) process with SiH$_2$Cl$_2$ gas, whereby an appropriate dopant gas is added for in situ doping. The semiconductor material grows both on the surface of the source terminal region as well as on the surface of the insulating, layer when a non-selective method is employed for growing the layer sequence. The semiconductor material grows as a single-crystal on the surface of the source terminal region but grows in polycrystalline form on the surface of the insulating layer. The polycrystalline semiconductor layer can be subsequently selectively removed relative to the single-crystal layer structure. The use of selective epitaxy has the advantage of eliminating the etching step.

A second opening is subsequently produced in the layer sequence. This second opening is at least of a depth that corresponds to the sum of the thicknesses of the drain region and the channel region and, potentially, of the source region as well. A gate dielectric is grown on the surface of the second opening and a gate electrode is grown on this gate dielectric. A conductive channel is formed along the surface of the second opening in the channel region during operation of the MOS transistor. MOS transistors having good electrical properties can be manufactured by this method because the second opening is located in the interior of the layer structure where the crystal lattice is essentially free of defects.

This manufacturing method is suitable for constructing an inverter that comprises two complementary transistors relative to one another. To that end, layer sequences having appropriate dopings are grown in the first opening. Layers that form source/drain regions in the circuit are, highly doped and deposited with a thickness of 50–200 nm. Layers that form channel regions in the circuit are more lightly doped with dopant concentrations in the range of $10^{17}$ through $10^{18}$ cm$^{-3}$ and are grown with a thickness of from 10–200 nm, and preferably from 50–100 nm. The thickness of these layers corresponds to the channel length of the corresponding MOS transistor.

It is especially advantageous to adapt the layer thicknesses to the depth of the first opening such that the layer sequence terminates essentially planarly with the surface of the insulating layer. Thereby resulting in a planar structure. It is especially desirable to provide those layers that form channel regions with a doping of less than or equal to $10^{18}$ cm$^{-3}$, whereas those layers that form source/drain regions are provided with a doping greater than or equal to $10^{19}$ cm$^{-3}$; it is also especially advantageous to form the gate dielectric by thermal oxidation at 700°–800° C. The gate dielectric of the more highly doped regions is thereby formed with approximately five times the thickness when compared to the more lightly doped layers that are utilized as the channel region. The greater thickness of the gate dielectric at the surface of the source/drain regions reduces the overlap capacitances.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
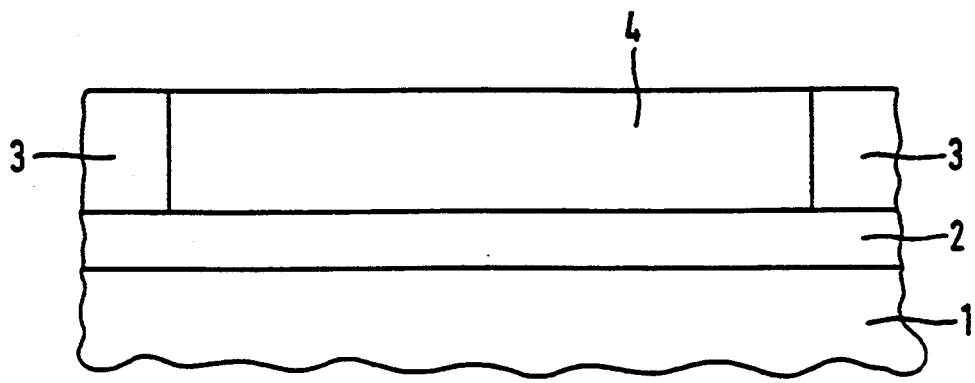
FIG. 1 shows a substrate having a source terminal region and an insulating layer having an opening.

FIG. 1 illustrates a preferred embodiment of the present invention wherein an MOS transistor with a source terminal region 2 is produced at a principal face of a substrate 1 which is p-doped, single-crystal silicon in the exemplary embodiment. The source terminal region 2 is n+-doped. The source terminal region 2 is doped with P, Sb or As and has a dopant concentration of approximately $10^{20}$ cm$^{-3}$. The source terminal region 2 can be realized either as continuous layer or as a well.

An insulating layer 3 such as SiO$_2$ is applied to cover the surface of the source terminal region 2. This is done either by deposition or oxidation to a thickness of approximately 200 nm. A first opening 4 is produced in the insulating layer 3 by a lithography step. For example, the first opening 4 may be formed by anisotropic etching. The surface of the source terminal region 2 is uncovered in the region of the first opening 4.

A layer structure of silicon that essentially fills up the first opening 4 and forms an essentially planar surface with the insulating layer 3 is produced within the first opening 4, preferably by selective epitaxy. Molecular beam epitaxy in the temperature range between 400° and 700° C. and in the pressure range between 0.1 mbar and 10 mbar or RTP-CVD with SiH$_2$Cl$_2$ gas as the process gas is particularly suitable for selective epitaxy. The doping of the layers forming the layer sequence ensues in situ during the epitaxy by adding a gas containing dopant to the process gas. For producing n-doped layers, in particular, ASH$_3$, SbH$_3$ or PH$_3$ is added. B$_2$H$_6$ is added for producing p-doped layers.

Figure 2:
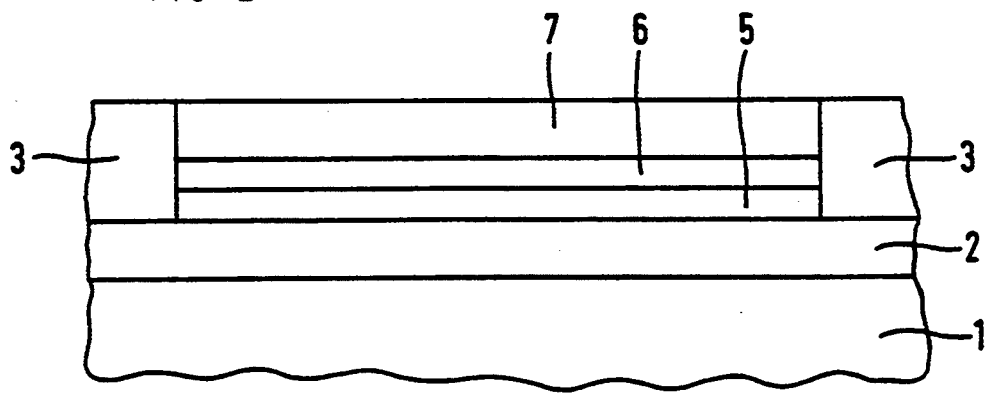
FIG. 2 shows the substrate after producing a layer structure in the opening of the insulating layer.

A first layer 5 is grown on the surface of the source terminal region 2 in the first opening 4. The first layer 5 is n+-doped with a dopant concentration of approximately $10^{20}$ cm$^{-3}$ by adding Sb or As. The first layer 5 is grown to a layer thickness of approximately 50 nm as shown in FIG. 2. A second layer 6 is grown on the first layer 5, this second layer 6 being p-doped in situ by adding B$_2$H$_6$ during the epitaxy. The second layer 6 has a dopant concentration of approximately $10^{18}$ cm$^{-3}$ and a thickness of approximately 50 nm. The second layer 5 forms a channel region. A third layer 7 that forms a drain region is grown onto the second layer 6. The third layer 7 is n+-doped with a dopant concentration of approximately $10^{20}$ cm$^{-3}$. This layer is formed by adding AsH$_3$ to the process gas during the selective epitaxy step. The third layer 7 is grown to a layer thickness of approximately 100 nm. The first layer 5, the second layer 6 and the third layer 7 form a layer structure that completely fills up the first opening 4 as illustrated in FIG. 2.

Figure 3:
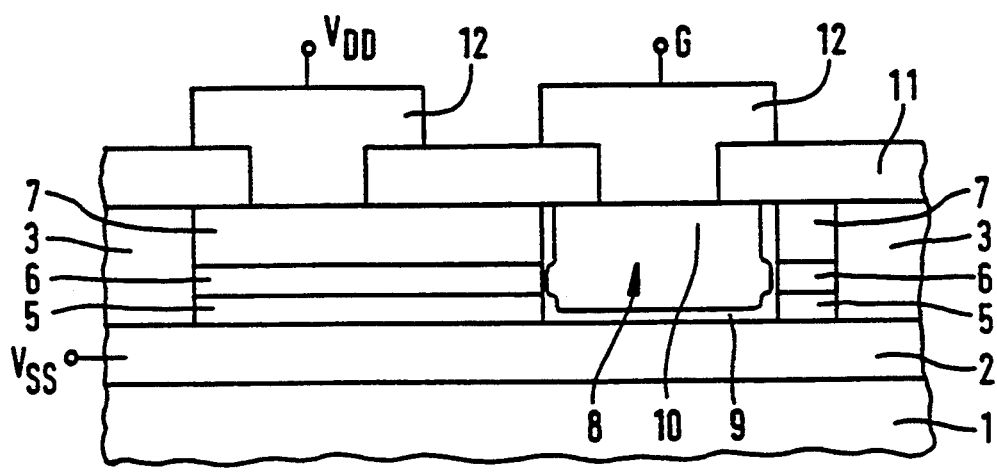
FIG. 3 shows a vertical MOS transistor that is realized in the layer structure.

A second opening 8 is etched in the layer structure formed of the first layer 5, the second layer 6 and the third layer 7 during a lithography step. The second opening 8 must extend at least into the first layer 5. Preferably, the second opening 8 is etched onto the surface of the source terminal region 2 as shown in FIG. 3.

Subsequently, a gate dielectric 9 is produced by oxidation at a temperature in the range between 700° and 800° C. The oxidation time is set such that a thickness of the gate dielectric 9 of approximately 5 nm is established at the surface of the second layer 6. A thickness that is higher by a factor of 5 forms at the surface of the highly doped first layer 5, third layer 7 as well as at the surface of the source terminal region during this time. This reduces the overlap capacitance.

Subsequently, the remaining clearance within the second opening 8 is filled with n+-doped polysilicon. The n+-doped polysilicon forms a gate electrode 10. The third layer 7, which is n+-doped, forms a drain region; the second layer 6, which is p-doped, forms a channel region; the first layer 5, which forms a source region, and the source terminal region 2, each being respectively n+-doped, form the effective source region of the MOS transistor in common with one another. The first layer 5 is grown onto the source terminal region 2 in order to assure a linear, vertical arrangement of source, channel and drain. The width of the MOS transistor is defined by the scope of the second opening 8. The channel length of the MOS transistor is defined by the thickness of the second layer 6. Layers having minimum thicknesses down to 5 nm can be produced with molecular beam epitaxy or by a RTP-CVD method that is utilized in the temperature range between 400° C. and 700° C. and pressure range between 0.1 mbar and 10 mbar. This layer thickness is the lower limit of the channel length that can be manufactured in accordance with the present invention.

An insulation layer 11 is applied surface-wide onto the insulating layer 3, the third layer 7, and the polysilicon fill that forms the gate electrode 10. Via holes to the gate electrode 10 as well as to the third layer 7, which acts as drain region, are opened in the insulation layer 11 and are provided with metalizations 12. The source terminal region 2 is contacted on the side of the first opening 4, for example, by a deeply extending via hole filled with a metalization that crosses through the insulation layer 11 and the insulating layer 3. During operation of the MOS transistor, the source terminal region 2 is connected to the supply voltage $V_{SS}$, the third layer 7 is connected to the supply voltage $V_{DD}$, and the gate electrode 10 is connected to the gate voltage G.

Figure 4:
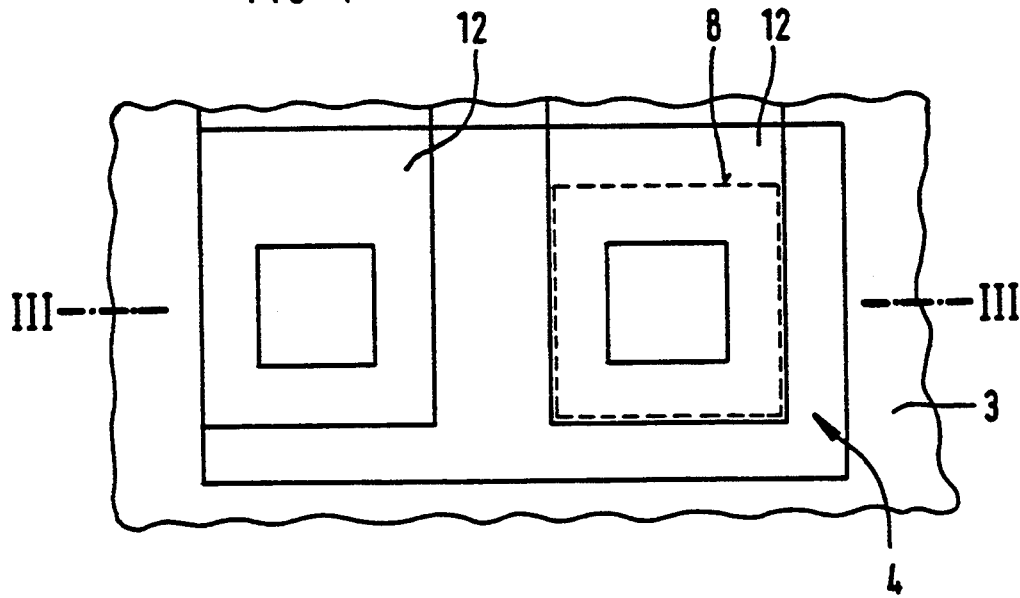
FIG. 4 shows a view onto the vertical MOS transistor.

FIG. 4 shows a plan view onto the MOS transistor explained with reference to FIG. 3. The section shown in FIG. 3 is referenced III—III in FIG. 4. In this example, the first opening 4 filled by the layer structure comprises a dimension of 1.2 $\mu m \times 2.2$ $\mu m$. The second opening that defines the width of the transistor has a dimension of 0.8 $\mu m \times 0.8$ $\mu m$. The via holes on the third layer 7, which acts as drain region, as well as the gate electrode 10 comprise a cross section of approximately 0.4 $\mu m \times 0.4$ $\mu m$. The cross section of the second opening 8 is shown in FIG. 4 as a broken line.

Figure 5:
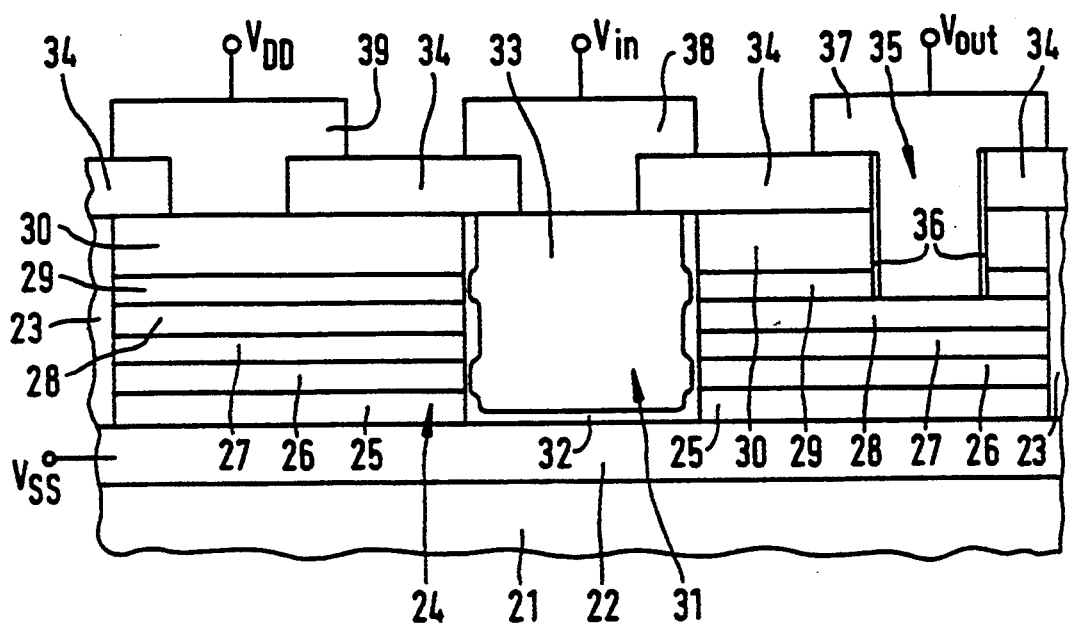
FIG. 5 shows a vertical inverter that is realized in a layer structure.

For manufacturing an inverter, a source terminal region 22 is formed at a principal face of a substrate 21 that, for example, is composed of p-doped, single-crystal silicon as shown in FIG. 5. The source terminal region 22 is n+-doped with a dopant concentration of $10^{20}$ cm$^{-3}$. The source terminal region 22 can be formed as a continuous layer or as a well. The source, terminal region 22 is preferably produced by diffusion.

An insulating layer 23 that, for example, is composed of $SiO_2$ and that has a thickness of, for example 350 nm is applied surface-wide onto the source terminal region 22. A first opening 24 is opened in the insulating layer 23. The first opening 24 is produced with a lithography step, for example by anisotropic etching. The surface of the source terminal region 22 is uncovered within the first opening 24.

A layer structure of silicon that essentially fills up the first opening 24 is grown within the first opening 24 by selective epitaxy. The selective epitaxy, wherein silicon essentially grows only on the surface of silicon whereas no silicon grows on the surface of the insulating layer 23, is implemented, for example, as RTP-CVD epitaxy with $SiH_2Cl_2$ gas in the temperature range between 400°–700° C. and in the pressure range from 0.1 through 10 mbar. The layers are deposited doped in situ by adding an appropriate dopant gas.

A first layer 25 that forms a source region is grown in the first opening 24 on the surface of the source terminal region 22, this first layer 25 being n+-doped with a dopant concentration of approximately $10^{20}$ cm$^{-3}$. The first layer 25 is grown with a thickness of approximately 50–100 nm. A second layer 26 that is p-doped and has a thickness of approximately 50 nm is grown onto the first layer 25. The second layer 26 forms a channel region in the inverter. The second layer 26 has a dopant concentration of approximately $10^{18}$ cm$^{-3}$. A third layer 27 that is n+-doped and has a dopant concentration of approximately $10^{20}$ $cm^{-3}$ and a thickness of approximately 50–100 nm is grown onto the second layer 26. A fourth layer 28 that is p+-doped and is grown with a dopant concentration of approximately $10^{20}$ cm$^{-3}$ and with a thickness of approximately 50–100 nm is grown onto the third layer 27. A fifth layer 29 that is n-doped with a dopant concentration of approximately $10^{18}$ cm$^{-3}$ and that is grown with a thickness of approximately 50 nm is grown onto the fourth layer 28. The fifth layer 29 forms a channel region in the finished inverter.

A sixth layer 30 that is p+-doped and is deposited with a dopant concentration of approximately $10^{20}$ cm$^{-3}$ and with a thickness of approximately 50–100 nm is grown onto the fifth layer 29. The sixth layer 30 is essentially flush with the surface of the insulating layer 23.

During a lithography step, a second opening 31 that extends at least into the first layer 25 is formed in the layer structure formed of the first layer 25, of the second layer 26, of the third layer 27, of the fourth layer 28, of the fifth layer 29 and of the sixth layer 30. The second opening 31 preferably extends down onto the surface of the source terminal region 22.

Subsequently, oxidation is implemented, preferably at 700°–800° C. to form a gate dielectric 32 along the surface of the second opening 31. The oxidation time is set such that a layer thickness of approximately 5 nm forms at the surface of the second layer 26 as well as of the fifth layer 29 that each respectively form channel regions in the inverter. Due to the difference in dopant concentration, a layer thickness that is increased approximately 5-fold thereby arises at the surface of the more highly doped first layer 25, third layer 27, fourth layer 28, sixth layer 30 and at the surface of the source terminal region 22. At the same time, an $SiO_2$ layer forms at the surface of the sixth layer 30 outside the second opening 31; this $SiO_2$ layer is not shown in FIG. 5 for the sake of clarity. The remaining clearance within the second opening 31 is filled up with n+-doped polysilicon in order to form a gate electrode 33.

An insulating layer 34 of, for example, $SiO_2$ is applied onto the surface of the insulating layer 23, the sixth layer 30 and the gate electrode 33. A third opening that extends down onto the surface of the fourth layer 28 is produced through the insulating layer 34, the sixth layer 30 and the fifth layer 29. The sidewalls of the third opening 35 are provided with insulating spacers 36. Insulating spacers 36 are produced, for example, by conformal deposition of a thin SiO2 layer and by subsequent anisotropic etching of the SiO2 layer. The third opening 35 is filled with a metalization, to form an output contact 37. A via hole on the gate electrode 33 is opened in the insulation layer 34 and is provided with a metalization for forming an input contact 36. A further via hole that extends onto the surface of the sixth layer 30 and is provided with a metalization is opened in the insulation layer 34 for manufacturing a contact 39 for a first supply voltage $V_{DD}$. The source terminal region 22 is contacted outside the excerpt shown in FIG. 5, being contacted by a via hole in the insulation layer 34 and in the insulating layer 23 that is filled with a metalization. This is connected to a second supply voltage $V_{SS}$ during operation.

Figure 6:
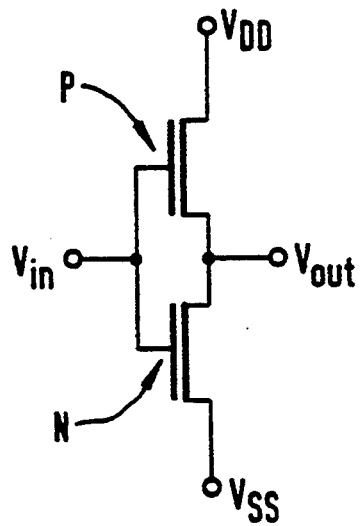
FIG. 6 shows a schematic circuit diagram of the inverter.

Together with the gate dielectric 32 and the gate electrode 33, the source terminal region 22, the first layer 25, the second layer 26 as well as the third layer 27 form an n-channel MOS transistor N of the inverter as shown in FIG. 6. In the n-channel transistor N, the second layer 26 acts as channel region, whereas source terminal region 22 and first layer 25 act as source and the third layer 27 acts as drain. The fourth layer 28, the fifth layer 29, the sixth layer 30, the gate dielectric 32 and the gate electrode 33 form a p-channel MOS transistor P of the inverter as shown in FIG. 6. The fifth layer 29 thereby acts as channel region, whereas the fourth layer 28 acts as source terminal region and the sixth layer acts as drain region. The fourth layer 27 is connected to the fifth layer 28 via a tunnel effect or, respectively, via the contact 35 that arise between an n+-doped region and a p+-doped region given dopant concentrations of $10^{20}$ cm$^{-3}$. The output contact 38 thus also contacts the third layer 27 via the fourth layer 28. An input signal $V_{in}$ is applied to the inverter via the input contact 38 and an output signal $V_{out}$ is available at the output contact 37.

A ring oscillator can be constructed in a simple way by using the manufacturing method of the invention by arranging a plurality of inverters in neighboring, first openings side-by-side and by respectively connecting the output contact of one inverter to the input contact of the next inverter.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

We claim:

1. Method of manufacturing a semiconductor device comprising the steps of:
    producing a source terminal region on a substrate;
    applying a first insulating layer on the source terminal region;
    providing a first opening in the first insulating layer that exposes a surface of the source terminal region;
    applying a first doped layer on the surface of the source terminal region;
    applying a second doped layer on the first doped layer;
    applying a third doped layer on the second doped layer;
    providing a second opening located in the third doped layer which extends at least into the first doped layer;
    applying a dielectric to an inside surface of the second opening;
    filling the second opening with doped polysilicon to form a gate electrode;
    applying a second insulating layer to the doped polysilicon;
    providing an electrical connection to the third doped layer;
    providing an electrical connection to the gate electrode; and
    providing an electrical connection to the source terminal region.

2. The method of manufacturing a semiconductor device of claim 1, wherein the step of applying said third doped layer comprises applying said third doped layer to a height so that a top surface of the third doped layer terminates essentially planarly with the surface of the first insulating layer.

3. The method of manufacturing a semiconductor device of claim 1, wherein the step of producing the source terminal region comprises the formation of a doped well.

4. The method of manufacturing a semiconductor device of claim 3, wherein the step of producing the source terminal region comprises the formation of a continuous doped layer.

5. The method of manufacturing a semiconductor device of claim 1, wherein the steps of applying the first, second, and third doped layers each comprise the step of applying a doped layer via molecular beam epitaxy.

6. The method of manufacturing a semiconductor device of claim 5, wherein the steps of applying the first, second and third doped layers each comprise the step of applying a doped layer via selective epitaxy.

7. The method of manufacturing a semiconductor device of claim 5 wherein the step of applying a doped layer via molecular beam epitaxy is carried out in the temperature range between 400° and 700° C. and in the pressure range between 0.1 mbar and 10 mbar.

8. The method of manufacturing a semiconductor device of claim 6, wherein the step of applying a doped layer via selective epitaxy is pereformed by RTP-CVD with SiH2Cl2 gas.

9. The method of manufacturing a semiconductor device of claim 6, wherein the step of applying a doped layer via selective epitaxy is performed by RTP-CVD with SiH4.

10. The method of manufacturing a semiconductor device of claim 1, wherein the first doped layer has a polarity which is opposite a polarity of the second doped layer.

* * * * *